United States Patent [19]
Gillette et al.

[11] Patent Number: 5,877,848
[45] Date of Patent: Mar. 2, 1999

[54] CONTINUOUS PRODUCTION OF CROSS-LINKED RESIN RELIEF IMAGES FOR PRINTING PLATES

[75] Inventors: Paul C. Gillette, Newark; Robert M. Walsh, Wilmington, both of Del.

[73] Assignee: MacDermid Imaging Technology, Incorporated, Waterbury, Conn.

[21] Appl. No.: 831,218

[22] Filed: Apr. 2, 1997

[51] Int. Cl.⁶ .............................. G03B 27/04; G03F 7/00
[52] U.S. Cl. ............................................. 355/85; 430/300
[58] Field of Search ................................ 355/53, 67, 78, 355/85, 86, 87; 430/137, 106, 300, 302, 396, 394, 306

[56] References Cited

U.S. PATENT DOCUMENTS

| | | | |
|---|---|---|---|
| 4,383,759 | 5/1983 | Bloothoofd et al. ....................... | 355/85 |
| 5,017,451 | 5/1991 | Larson et al. ............................. | 430/137 |
| 5,629,052 | 5/1997 | Trokhan et al. .......................... | 427/500 |
| 5,653,929 | 8/1997 | Miele et al. .............................. | 269/173 |
| 5,735,983 | 4/1998 | Goss et al. ................................. | 156/64 |
| 5,750,315 | 5/1998 | Rach ......................................... | 430/306 |

Primary Examiner—Howard B. Blankenship
Assistant Examiner—Henry Hung Nguyen
Attorney, Agent, or Firm—William A. Simons; William B. Slate; Wiggin & Dana

[57] ABSTRACT

Printing plates are formed from a layer of photopolymerizable resin by a process and assembly which involves moving a resin layer past a variable intensity light source so as to sequentially and selectively cross-link the resin layer as the resin layer moves past the light source.

19 Claims, 6 Drawing Sheets

CONTINUOUS PRODUCTION OF CROSS-LINKED RESIN RELIEF IMAGES FOR PRINTING PLATES

BACKGROUND OF THE INVENTION

1. Field of the Invention

This invention relates to the production of printing plates from photopolymerizable resins. More particularly, this invention relates to the production of printing plates wherein a resin layer is selectively cross-linked by being moved past a varying intensity light source.

2. Brief Description of the Art

The production of printing plates by selectively cross-linking polymerizable resins is known in the prior art. The printing plate is conventionally formed by first placing a negative on a supporting glass plate. An optically transparent release film is then placed on top of the negative which is subsequently coated with a layer of photopolymerizable resin. A backing sheet is then placed on top of the photopolymerizable resin, and the backing sheet is then covered by another glass sheet. Irradiation by actinic light, such as UV light, through the top glass/backing sheet combination forms a solid floor layer of photoresin, which adheres to the backing sheet. The thickness of the floor layer is less than the total thickness of the photoresin. Irradiation through the lower glass plate negative release sheet selectively hardens the photoresin to form an image-printing surface which mirrors the image on the negative. The hardened regions adhere to the floor layer, but not the transparent release sheet. Subsequent processing removes unhardened (liquid) photoresin to reveal a relief image.

When following the teachings of the prior art, the photopolymerizable resin layer can be placed on the glass plate and a capping blade can be drawn across the resin layer so as to level the layer of resin on the glass plate. The result is a relatively constant thickness resin layer formed on the supporting glass plate in the printing plate production assembly. The uniform layer of resin is then exposed to a UV light source through the negative so as to produce cross-linked solid areas in the resin layer which form a printing image or pattern in the resin layer. The non-cross-linked liquid portions of the resin layer are then removed from the plate, and the result is a selectively relieved cross-linked resin printing pattern on the plate. The aforesaid procedure for producing printing plates is relatively time consuming, and, is to some degree, size-restrictive. Direct production of large relief images requires large pieces of very flat glass. The photo negatives required can be both costly and time-consuming to produce.

It would be desirable to provide a process and assembly which would be able to produce different sized printing plates in a continuous fashion with, or without, the need for an image-producing negative, and without the required set up time of the prior art procedure. This is especially true for time-critical applications such as newspapers.

BRIEF SUMMARY OF THE PRESENT INVENTION

This invention relates to a method and apparatus for use in producing printing plates, by extruding a predetermined thickness layer of a photopolymerizable resin, and by moving the extruded resin layer past a variable intensity light source. The intensity of the light source can be controlled by a preprogrammed microprocessor in several ways. One way of providing the variable intensity light source involves the use of a bank of lights which can be selectively turned "on" and "off"; or can be selectively dimmed or brightened, by the use of microprocessor-controlled switches or rheostats. Selective cross-linking of the resin can be performed within the extrusion die; or the resin can be extruded onto a moving transparent support plate, and the variable intensity light source can be positioned above or below the support plate. In either case, the variable intensity light source may be controlled by a preprogrammed microprocessor, as described above. Alternatively, the light intensity of the light source may be controlled by the use of preprogrammed video signals in conjunction with a suitable video image-producing device.

Another way of providing the variable intensity light source involves moving the resin layer past a fixed intensity light source, and utilizing a movable negative which can be moved past the fixed intensity light source at the same time as the resin layer is being moved past the fixed intensity light source. In either case, the result will be a selectively cross-linked resin layer wherein the cross-linked solid portions of the resin will produce the desired printing pattern on the printing plate.

Still another way of providing the variable intensity light source involves moving the resin layer past a fixed intensity light source, and utilizing a fixed programmable mask which can be selectively manipulated to expose sequential portions of the resin layer as the resin layer is being moved past the programmable mask and the fixed intensity light source.

In each of the aforesaid cases, the result will be a selectively cross-linked resin layer, wherein the cross-linked solid portions of the resin will produce the desired printing pattern on the printing plate.

In certain cases, the assemblage may also include a constant intensity light array which can form a cross-linked floor for the printing plates. When a constant intensity light source is employed in order to produce a cross-linked floor on the printing plate, the constant intensity light source will be located preferably upstream (relative to the direction of movement of the resin layer) of the variable intensity light-printing pattern-forming light source. Thus, the cross-linked polymer base or floor of the plate will form before the cross-linked printing pattern is formed on the plate.

It is therefore an object of this invention to provide a method and apparatus for producing cross-linked polymer printing plates by serially cross-linking adjacent sections of a layer of cross-linkable resin.

It is a further object of this invention to provide a method and apparatus of the character described which continuously produces cross-linked polymer printing plates from a moving layer of resin.

It is an additional object of this invention to provide a method and apparatus of the character described which automatically produces a cross-linked inking relief pattern and a cross-linked floor on the printing plates.

It is another object of this invention to provide embodiments of a method and apparatus of the character described which produces cross-linked polymer printing plates without the need of a negative to define the pattern on the printing plates.

These and other objects and advantages of the invention will become more readily apparent from the following detailed description of several embodiments thereof when taken in conjunction with the accompanying drawings in which:

DETAILED DESCRIPTION OF THE PREFERRED EMBODIMENT OF THE PRESENT INVENTION

Figure 1:
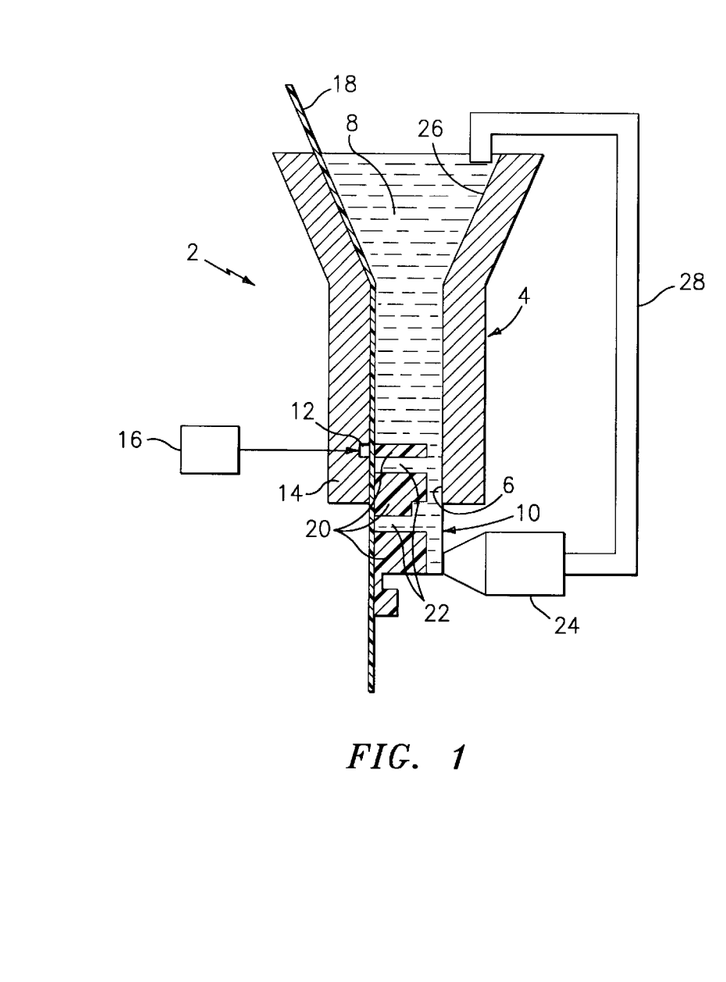
FIG. 1 is a somewhat schematic cross-sectional view of a resin extrusion assembly formed in accordance with this invention.
Figure 2:
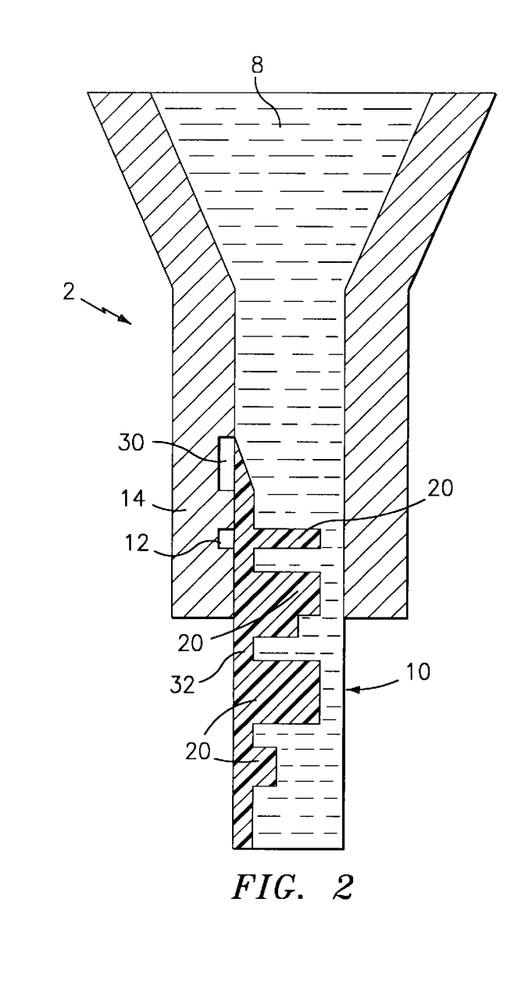
FIGS. 2. and 2A are a view similar to FIG. 1 but show modified extrusion assemblies formed in accordance with this invention.
Figure 2A:
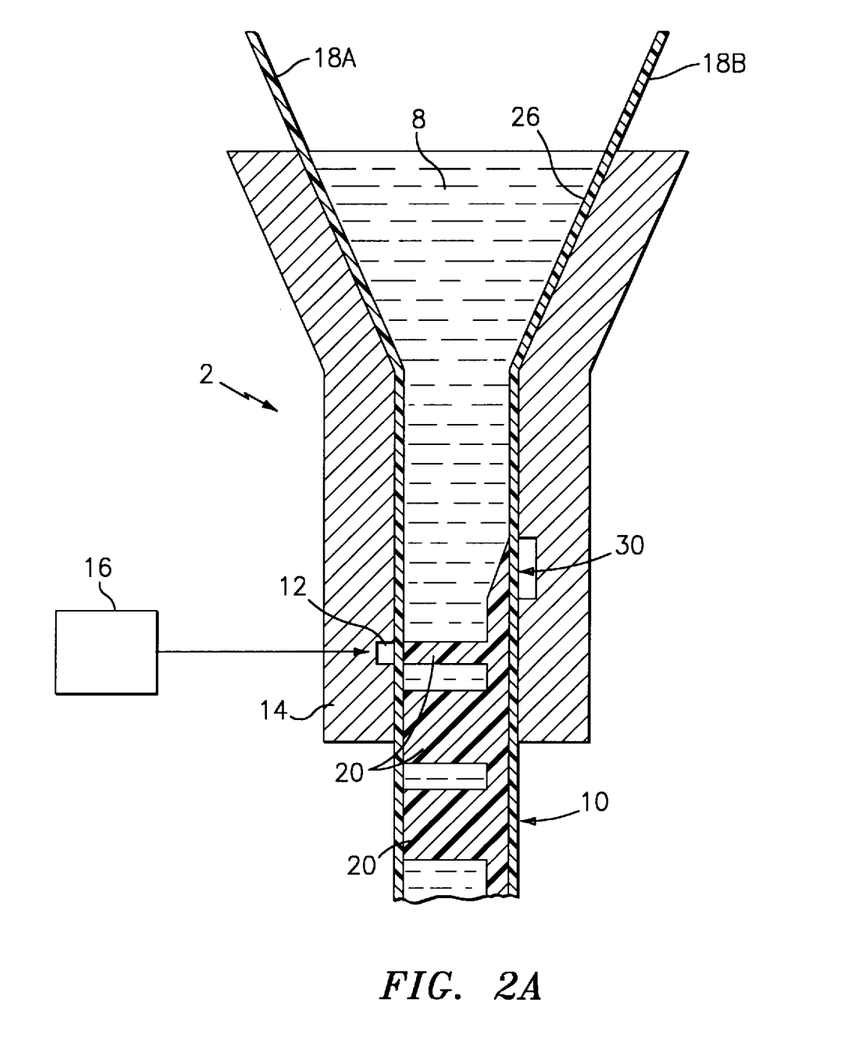

Referring now to the drawings, there is shown in FIGS. 1–4 various embodiments of a photopolymer resin extrusion assembly, which is denoted generally by the numeral 2, and which has been formed in accordance with this invention. In describing the embodiments of the invention shown in FIGS. 1–4, the same numerals will be used to identify similar components of each of the different embodiments of the invention. The extrusion assembly 2 includes an extrusion die 4 with an extrusion orifice 6 through which the photopolymerizable resin 8 is extruded. The orifice 6 will be configured so as to produce a resin layer 10 of an appropriate shape for use as a printing plate. Generally, the orifice will therefore be rectangular in cross section. A programmable light array 12 is disposed in one wall 14 of the assembly 2. Actuation of the light array 12 is controlled by a preprogrammed microprocessor 16. A transparent film substrate 18 will be fed through the extrusion die 4 past the light array 12 and out through the orifice 6. The substrate 18 serves to interconnect the cross-linked portions of the resin layer 10, and therefore serves as a support for the finished printing plates while preventing adhesion of the cross-linked resin to the flat glass supporting surface 19 over which the substrate 18 moves. The substrate 18 should be transparent and preferably be provided with a top surface which is treated in a manner which will promote adhesion of the cross-linked polymer 20 to the substrate 18. As noted above, the intensity of the light array 12 is selectively variable so that its ability to cross-link the resin stream flowing past it can be varied. The result of this varying intensity light source is the formation of separate cross-linked areas 20 which are each connected to the substrate 18, and which are separated from each other by liquid areas of non-cross-linked resin 22. The cross-linked areas 20 in the resin layer 10 form the resultant printing plate relief surface, and therefore, the printing pattern of the printing plate. As shown in FIG. 1, a downstream liquid resin recovery station 24 can be included so as to remove the non-cross-linked liquid resin 22 from the resin layer 10 and optionally return the liquid resin back to the extruder reservoir 26 through a line 28. In the embodiment of the invention illustrated in FIG. 2, a constant intensity light source 30 is disposed in the assembly wall 14 upstream of the variable intensity light array 12. The purpose of the constant intensity light source 30 is to form a cross-linked floor 32 in the resin layer 10, which floor 32 serves to interconnect the various cross-linked areas 20, and which essentially takes the place of the substrate 18, or is additive to it. FIG. 2A shows an embodiment of an extruder 2 which includes a second release film 18B which passes over the light source 30 that is used to form the printing plate floor. The use of two release films 18 and 18B ensures that the solidified resin will not stick to the extruder die surfaces as the assembly leaves the die.

Figure 3:
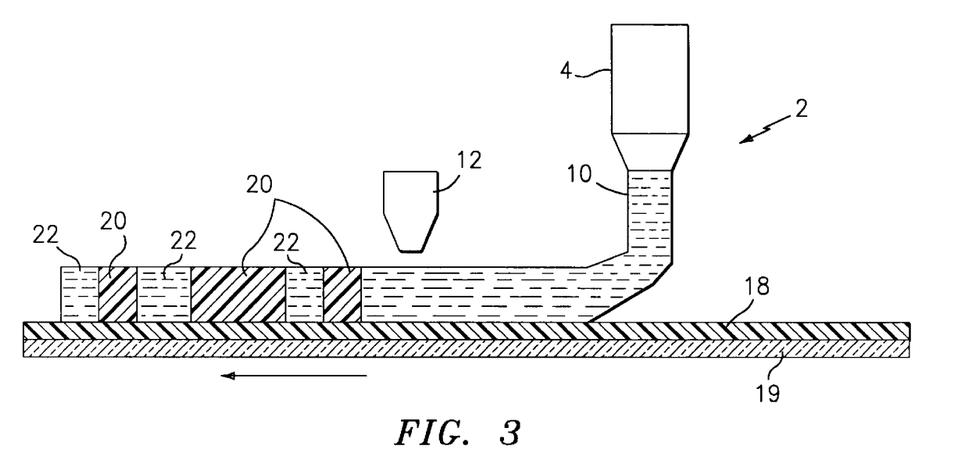
FIGS. 3 and 4 are cross-sectional views of yet another embodiment of an extrusion assembly formed in accordance with this invention.
Figure 4:
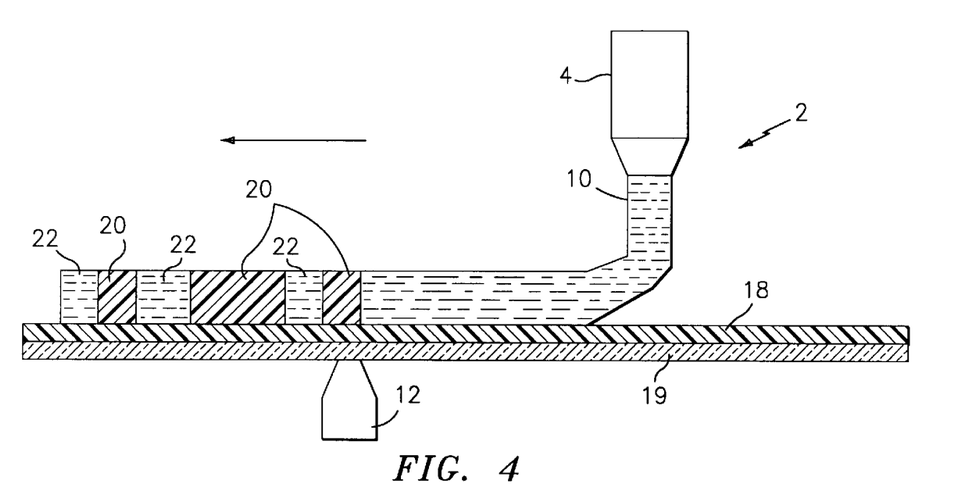

FIGS. 3 and 4 show two similarly configured further embodiments of a printing plate-production assembly 2 which is formed in accordance with this invention. In the embodiments shown in FIGS. 3 and 4, the resin layer 10 is extruded from the die 4 down onto a moving film substrate 18. Once the layer 10 settles onto the substrate 18, it is moved past a variable intensity light source 12 which may be disposed either above or below the substrate 18. The light source 12 is operable to selectively cross-link the resin layer 10 so as to form individual cross-linked areas 20 with intervening non-cross-linked liquid resin areas 22. It will be appreciated that the embodiments illustrated in FIGS. 3 and 4 may be utilized to upgrade or modify existing equipment so as to enable such equipment to operate in accordance with the precepts of this invention.

Figure 5:
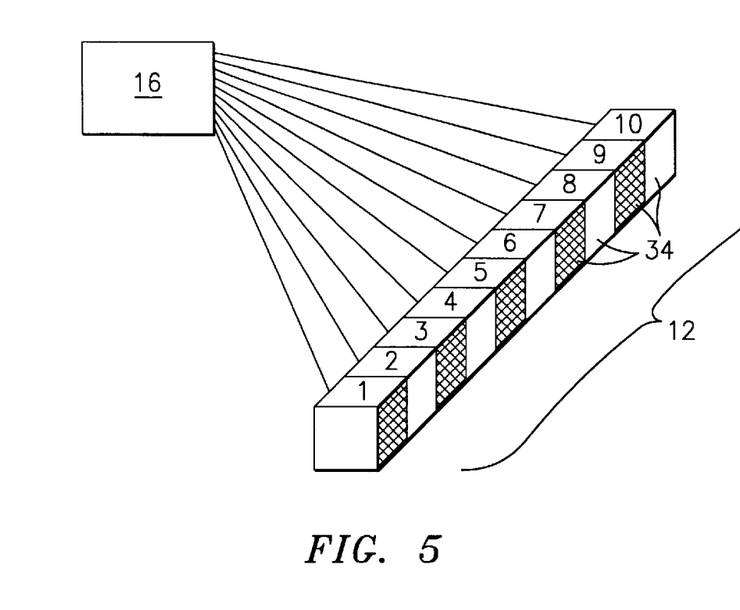
FIG. 5 is a schematic representation of one embodiment of a variable intensity light source for use in an extrusion assembly formed in accordance with this invention.
Figure 6:
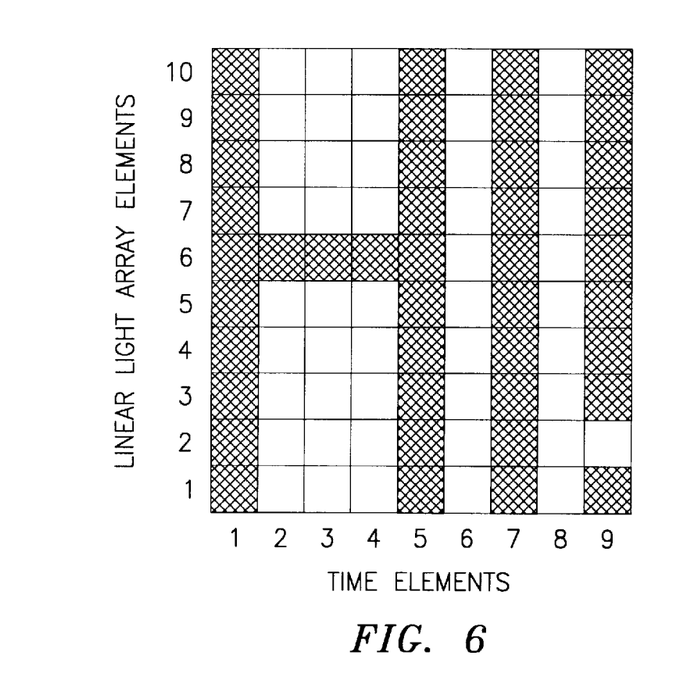
FIG. 6 is a graphic representation of a manner of manipulating the variable intensity light source so as to form a particular printing pattern in a cross-linked resin printing plate.

Referring now to FIGS. 5 and 6, FIG. 5 is a schematic representation of a linear light array 12 wherein the intensity of the individual light sources 34 in the light array 12 are controlled by the preprogrammed microprocessor 16. The light array 12 is depicted as including ten individual and discrete light sources 34 which can be selectively switched on and off by the microprocessor 16 via a conventional switching system. Obviously, the number of individual light sources 34 in the light array can be varied in accordance with requirements. In FIG. 5, individual light sources 34 which are shown as being double cross-hatched, are light sources which are switched "on"; and individual light sources 34 which are shown as being non-cross-hatched, are light sources which are switched "off". The individual light sources 34 can be lamps, light emitting diodes, light transmitting fiber optic strands, or the like. Alternatively, liquid crystal displays or selectively movable micromirrors can be employed to selectively modulate the spatial light intensity of one or more light sources.

FIG. 6 is a schematic representation of a sequencing pattern for the light sources 34 over an incremental time span that will result in a particular cross-linked printing pattern, which has been illustrated for simplicity as being the text "HI!". In the example represented in FIG. 6, the time needed to produce the printing plate is divided into nine equal increments. In FIG. 6, the X axis shows the numbered nine time increments; and the Y axis shows the condition of the numbered ten individual light sources 34. Reviewing FIG. 6, it will be noted that during time increment #1, all of the ten light sources 34 will be at cross-linking intensity, thus cross-linking the initial vertical leg of the letter "H" in the resin layer. During time increments #2, 3 and 4, only the 6th light source 34 will be at cross-linking intensity, thus cross-linking the cross bar of the letter "H". During time increment #5, all of the ten light sources 34 will be at cross-linking intensity, thus cross-linking the second vertical leg of the letter "H" in the resin layer. At time increment #6, none of the ten light sources 34 will be at cross-linking intensity, thus allowing the formation of a space in the cross-linked portions of the text. During time increment #7, all of the ten light sources 34 will be at cross-linking intensity, thus cross-linking the letter "I" in the text. The aforesaid having been explained, the remainder of FIG. 6 will be readily understood by one of skill in the art.

Figure 7:
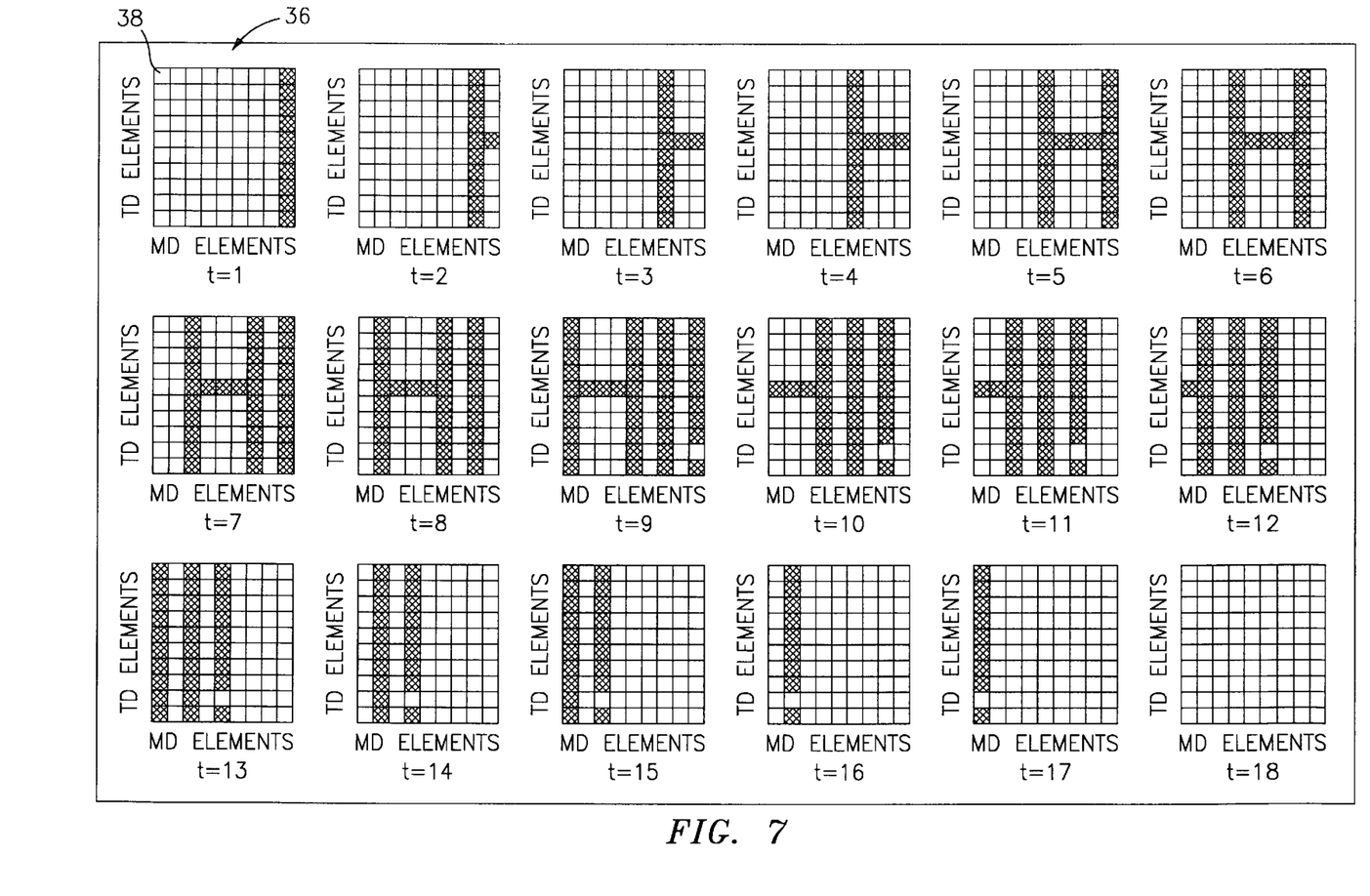
FIG. 7 is a graphic representation of a rectilinear programmable mask which may be utilized to produce the aforesaid printing pattern.

FIG. 7 illustrates graphically a selectively programmable rectilinear mask which is denoted generally by the numeral 36, and which is formed from a matrix of cells 38 which can be selectively rendered transparent and opaque. The cells 38 can take the form of liquid crystals, the state of which is controlled by a pre-programmed microprocessor. The mask 36 as depicted in FIG. 7 includes nine stacks of ten cells 38, for a total of ninety cells 38 in all. FIG. 7 illustrates, from the upper left hand corner to the lower right hand corner, eighteen successive mask configurations (t=1 through t=18), which configurations can be created to produce a particular cross-linked printing pattern, which has been illustrated once again for simplicity as being the text "HI!". It will be understood that the liquid resin layer is disposed on one side of the mask 36, and a light source is disposed on an opposite side of the mask 36, whereby the light can reach the resin layer only through the mask 36. In the illustration, it will be understood that the resin layer moves from right to left past the mask 36, and that the cells 38 which are double-crosshatched are transparent, and the clear cells 38 are opaque. In the "t=1" configuration, the righthandmost stack of cells 38 is transparent, and the remainder of the cells 38 are opaque. FIG. 7 illustrates how the cells 38 in the mask 36 are progressively rendered transparent and opaque as the resin layer moves past the mask 36, so as to form the cross-linked printing pattern for the word "HI!".

Figure 8:
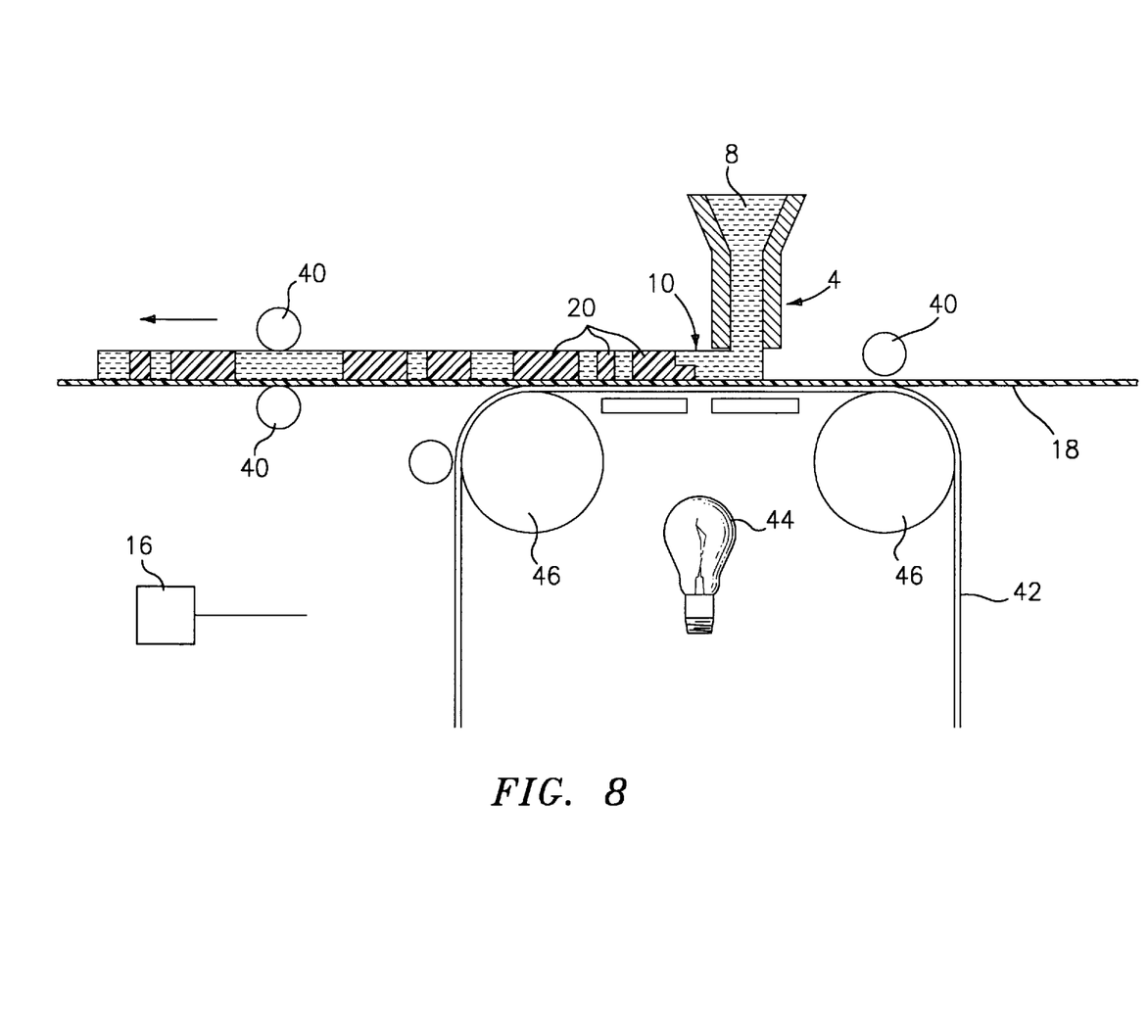
FIG. 8 is a schematic elevational view of an embodiment of the invention which utilizes a moving negative for forming a printing plate in accordance with this invention.

Referring now to FIG. 8, there is shown an embodiment of the invention which utilizes a moving negative in conjunction with a moving resin layer to form the printing plate. The numeral 4 denotes the extrusion die; the numeral 8 denotes the liquid resin in the die; the numeral 10 denotes the extruded resin layer; the numeral 18 denotes the support film; and the numeral 20 denotes the cross-linked portions of the resin layer. FIG. 8 discloses a system wherein the resin layer 10 is extruded from the die 4 onto the support film 18. The support film 18 moves from right to left as viewed in FIG. 8, as does the extruded resin layer 10. Movement of the support film 18 is guided and controlled by guide rollers 40. The printing plate pattern to be produced in the resin layer 10 is dictated by a negative 42 which is moved past a constant light source 44, along with the support film 18 and resin layer 10. As the negative 42 and resin layer 10 move past the light source 44, sequential portions of the resin layer 10 are cross-linked in response to light passing through sequential transparent portions of the negative 42. At the same time, sequential portions of the resin layer 10 which are shielded from the light source 44 by opaque portions of the negative 42 remain liquid. The resultant cross-linked printing pattern is indicated by the numeral 20. Movement of the negative 42 is controlled by sprocket rolls 46. The rate of movement of the resin layer 10, the support film 18 and the negative 42 are dictated by the microprocessor controller 16.

By following the teachings of this invention, printing plates can be formed from photopolymerizable resins. It will be apparent to those of skill in the art that liquid photoresins flowing from the extrusion die could be selectively controlled across the die width by means of appropriately sized dams which will serve to prevent material from exiting the die. This technique will enable a single die to produce variable width plates. Additionally, die designs for co-extruding different layers of resins with different physical, mechanical or optical properties may be employed. It will be appreciated that the technique of this invention can produce large size printing plates without the need of expensive and difficult to produce negatives, and without the need to employ unusually large flat glass support plates. The plate production process can be controlled by a preprogrammed controller, such as a microprocessor. When either a variable light array or a programmable mask is used, either the linear configuration or the rectilinear configuration of the light array or mask can be utilized. The selection of a linear or rectilinear variable intensity light source may depend on the extent of irradiation needed to polymerize the particular resin being used to produce the printing plates.

Since many changes and variations of the disclosed embodiment of the invention may be made without departing from the inventive concept, it is not intended to limit the invention otherwise than as required by the appended claims.

What is claimed is:

1. A system for producing cross-linked photopolymerized printing plates, said system comprising:

a) means for producing a moving layer of photopolymerizable cross-linkable resin; and b) a variable intensity light source disposed adjacent to the layer of cross-linkable resin, said variable intensity light source being operable to form a selectively cross-linked resin printing pattern in the layer of cross-linkable resin as the latter moves past said variable intensity light source.

2. The system of claim 1 wherein said means for producing a moving layer of resin is an extrusion die.

3. The system of claim 2 wherein said variable intensity light source is disposed in a wall of said extrusion die.

4. The system of claim 2 further comprising means for removing non-polymerized resin from the resin layer and returning the removed resin to said extrusion die.

5. The system of claim 1 further comprising a fixed intensity light source upstream of said variable intensity light source, said fixed intensity light source being operable to form a cross-linked printing plate floor in the moving resin layer.

6. The system of claim 1 further including a movable transparent substrate for receiving and supporting the resin layer and for forming a printing plate floor.

7. The system of claim 6 wherein said transparent substrate adheres to solidified photoresin.

8. The system of claim 7 further including a second movable transparent substrate for covering a portion of the resin layer opposite to the printing plate floor, which second transparent substrate is non-adherent to solidified photoresin.

9. The system of claim 1 wherein said variable intensity light source includes a linear array of discrete selectively modulated light emitters.

10. The system of claim 1 wherein said variable intensity light source includes a constant light emitter, and means for moving a negative of the printing pattern past said constant light emitter in synchronization with movement of the resin layer past said constant light emitter.

11. The system of claim 1 wherein said variable intensity light source includes a constant light emitter, and a programmable mask disposed between said constant light emitter and the moving resin layer, said mask being selectively operable to transmit and block light therethrough from said constant light emitter in a manner which will form the printing pattern in said mask.

12. The system of claim 11 wherein said programmable mask is a liquid crystal display.

13. The system of claim 12 wherein said liquid crystal display is an active matrix liquid crystal display.

14. The system of claim 12 wherein said liquid crystal display has a linear configuration.

15. The system of claim 12 wherein said liquid crystal display has a rectilinear configuration.

16. A method for producing a cross-linked printing plate from a layer of photopolymerizable resin, said method comprising the steps of:

a) moving said layer of resin along a predetermined path;

b) positioning a variable intensity light source adjacent to said predetermined path; and c) moving said layer of resin past said variable intensity light source while manipulating light emitted from said variable intensity light source in a manner which will produce a selectively cross-linked resin printing pattern in said layer of resin.

17. The method of claim 16 wherein said variable intensity light source includes a linear light array comprising individual light emitters, and wherein the step of manipulating is accomplished by selectively controlling the intensity of light emitted by each of said individual light emitters.

18. The method of claim 16 wherein said variable intensity light source includes a programmable mask in combination with a constant light emitter, and wherein the step of manipulating is accomplished by selectively controlling the pattern of light transmitted from said constant light emitter to said layer of resin through said programmable mask.

19. The method of claim 16 wherein said variable intensity light source includes a movable negative in combination with a constant light emitter, and wherein the step of manipulating is accomplished by selectively controlling the pattern of light transmitted from said constant light emitter to said layer of resin through said movable negative by moving said negative and said layer of resin past said constant light emitter in synchronous fashion.

\* \* \* \* \*